April 8, 1958 J. MOFENSON 2,830,199

PULSE GENERATING CIRCUITS

Filed Nov. 30, 1954

INVENTOR
JACK MOFENSON
BY Elmer J. Gorn
ATTORNEY 2,830,199
Patented Apr. 8, 1958

2,830,199

PULSE GENERATING CIRCUITS

Jack Mofenson, Medford, Mass., assignor to Raytheon Manufacturing Company, Waltham, Mass., a corporation of Delaware Application November 30, 1954, Serial No. 472,163

4 Claims. (Cl. 307—88.5)

This invention relates generally to pulse generators, and more particularly to pulse generators employing a semiconductor device.

It is often desirable, for example, in time division multiplex communication systems, to generate pulses of controlled width having extremely rapid rise and fall times. In the past the transistor device most commonly used to achieve generation of short pulses with fast rise and fall times has been the point-contact multivibrator having a capacitor or other pulse-forming network connected in the emitter circuit. This arrangement has been found to be highly unsatisfactory where the width of the output pulse must be accurately controlled since the output pulse width is dependent on transistor parameters, thus necessitating circuit adjustments for proper operation when transistors are interchanged. In addition the effects of "hole storage," i. e. the continued migration of current carriers to the collector even after the emitter current has been shut off, result in a stretched output pulse, thus further limiting the accuracy to which the pulse width may be controlled.

In accordance with the present invention, an improved pulse generator is provided utilizing a delay line in the collector circuit of a point contact transistor, or other transistor with an emitter-to-collector current gain greater than unity, to generate a constant amplitude pulse in which the effects of hole storage are eliminated, thus producing a pulse of definite width. In another form of the invention, a plurality of transistors may be used in conjunction with a delay line in the collector circuit of one of them to produce a variable width pulse whose width is controlled by the application of two closely-spaced triggers to the transistors.

The invention will be better understood as the following description proceeds taken in conjunction with the accompanying drawing, wherein.

Figure 1:
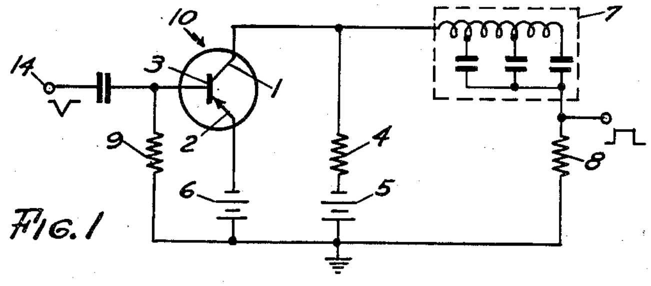
Fig. 1 is a schematic representation of a pulse generator in accordance with the invention.

Referring now to the drawing and more particularly to Fig. 1 thereof, there is shown generally at 10 a point contact type of transistor having a collector electrode 1, an emitter electrode 2, and a base electrode 3. A comparatively large negative bias is supplied to collector electrode 1 through a resistor 4 connected to the negative terminal of a battery 5. Base electrode 3 is biased slightly negative with respect to ground, due to a small flow of leakage current through the collector circuit and resistor 9. Emitter electrode 2 is connected to a source of negative potential, such as a battery 6, of sufficient value to hold the emitter electrode 2 more negative than base electrode 3. A delay line, indicated within the dotted area 7, has one end connected to collector electrode 1, and its other end connected to the ground side of the circuit through a load resistor 8 which has a value that is substantially equal to the characteristic impedance of the delay line 7.

The circuit just described may be used to produce constant amplitude pulses of accurately controlled width. With the bias arrangement shown, transistor 10 is normally nonconducting due to the negative potential applied to the emitter electrode 2. However, with the application of a negative trigger pulse to base electrode 3, the emitter is made positive relative to the base, thus allowing a large flow of current in the collector circuit due to the regenerative characteristics of the transistor. This current flows for a length of time determined by the discharge time of delay line 7 and produces the desired constant amplitude output pulse which will appear across resistor 8.

As an example of the operation of the circuit of Fig. 1, it will be assumed that battery 6 has a value of —4.5 volts, battery 5 has a value of —45 volts, resistor 9 is 510 ohms, resistor 4 is 6800 ohms, resistor 8 is 500 ohms, and the characteristic impedance of delay line 7 is 500 ohms. With the values assumed, base electrode 3 will be held at a quiescent value of approximately —1 volt indicated at point A on the N curve of Fig. 2. The constant emitter potential supplied by battery 6 is indicated by the dotted line 12. With the transistor in the "off" condition, the effective impedance in the collector circuit may be considered to be the 6800 ohms of resistor 4 since the delay line 7 presents a high impedance to a steady state voltage. When the N curve 13 is drawn for a value of 6800 ohms, it is seen that the transistor cannot be in the "on" condition with the emitter voltage held at —4.5 volts since emitter current, and thus collector current, will only flow when the emitter electrode 2 is more positive than base electrode 3, or with the biasing arrangement of Fig. 1 when the base electrode 3 is more negative than emitter electrode 2. However, when a sharp negative trigger pulse sufficient to drive base electrode 3 more negative than —4.5 volts is applied to terminal 14, emitter and collector current will suddenly start to flow, and in the presence of the change in collector current the impedance of delay line 7 will drop to its characteristic value of 500 ohms. The effective impedance in the collector circuit thus momentarily becomes something slightly less than 1,000 ohms consisting of resistor 4 in parallel with the series combination of the characteristic impedance of delay line 7 and resistor 8. The transistor 10 is now operating on the N curve 15 which represents a 1,000 ohm value, and will remain at point B as long as the effective impedance in the collector circuit is 1,000 ohms.

The large change in collector current at the time the transistor reaches the "on" condition produces a positive voltage wave front across the delay line 7 which travels down the line and is reflected back with the same polarity to be absorbed in the matching termination made up of the saturating impedance of transistor 10 in series with resistor 8. At this instant, the delay line 7 again presents a very high impedance to the collector circuit so that operation is now back on the 6800 ohm curve of Fig. 2, and the transistor current drops regeneratively to a point where conduction ceases.

Since during the time that the wave is traveling down delay line 7 and back again the line continuously presents its characteristic impedance to the collector circuit, constant current will flow through resistor 8 for twice the delay interval of the line, thus producing a constant amplitude pulse. The rise and fall times of the pulse are extremely rapid, and since at the time the transistor returns to the "off" condition the delay line 7 presents a high impedance to the collector, any current due to the effects of "hole storage" will not appear in the output pulse.

Figure 2:
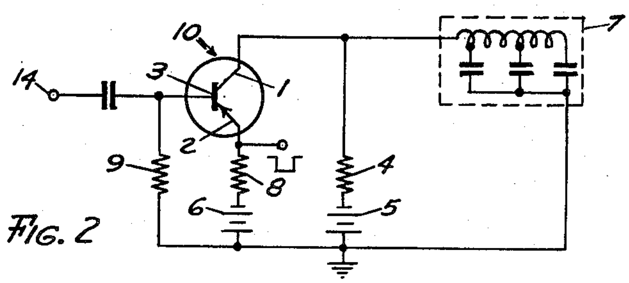
Fig. 2 is a schematic representation of a pulse generator similar to that of Fig. 1 except that a negative output pulse may now be obtained.

Although the output has been shown as a positive pulse across resistor 8 in Fig. 1 it should be understood that a negative pulse may be obtained by inserting resistor 8 in the emitter circuit as shown in Fig. 2. If pulses of both polarities are desired, two resistors may be used, one placed in a position corresponding to that of resistor 8 in Fig. 1, and the other placed in a position corresponding to that of resistor 8 in Fig. 2 provided that the series sum of the two resistances is equal to the value of resistor 8, i. e. substantially equal to the characteristic impedance of delay line 7.

Figure 3:
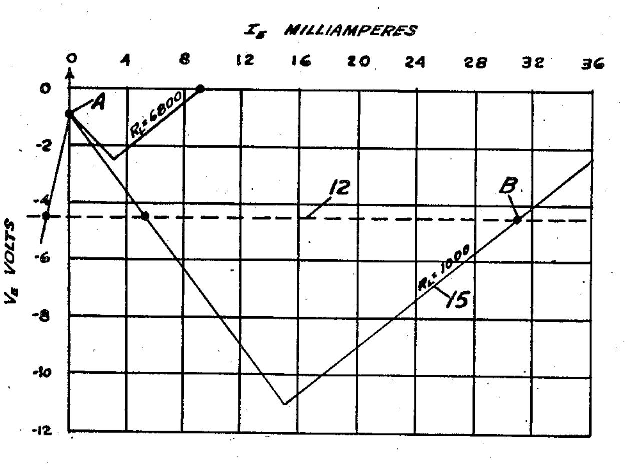
Fig. 3 is a so-called "N curve" plot of emitter voltage versus emitter current useful in explaining the operation of the circuit of Fig. 1.
Figure 4:
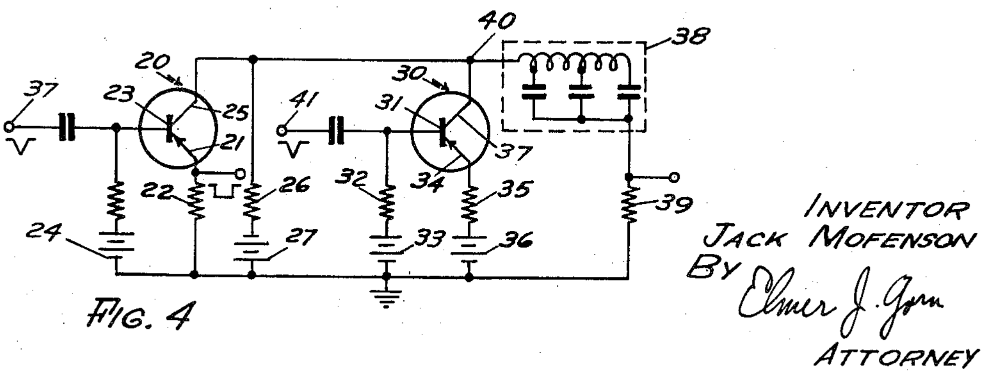
Fig. 4 is a schematic representation of another form of the pulse generator in accordance with the present invention.

In Fig. 3 there is shown another embodiment of the invention wherein two transistors are used as a multiple switch across a single delay line to produce an output pulse of variable width dependent on the timing of triggers applied to the transistors. In the figure, transistor 20 has emitter electrode 21 connected through resistor 22 to ground, base electrode 23 connected to the positive terminal of battery 24, and collector electrode 25 connected through a resistor 26 to the negative terminal of battery 27. A second transistor 30 has its base electrode 31 connected through resistor 32 to the positive terminal of battery 33, its emitter electrode 34 connected through a resistor 35 to the positive terminal of battery 36, and its collector electrode 37 connected to the collector 25 of transistor 20. The operation of the circuit of Fig. 4 is such that the application of a negative trigger to terminal 37 drives the transistor 20 into constant current conduction as it begins to discharge the energy stored in delay line 38 through resistors 39 and 22 in a manner similar to that explained in connection with the circuit of Fig. 1. Before the normal discharge time of delay line 38, a second negative trigger pulse applied to terminal 41 drives normally nonconducting transistor 30 regeneratively into conduction and delay line 38 tends to discharge toward the positive potential of emitter electrode 34. Since the emitter 34 is connected to a positive potential of battery 36, when transistor 30 begins to conduct, point 40, and therefore the collector 25 of transistor 20, are driven positive with respect to the emitter 21, thus extinguishing the current flow in transistor 20. The voltage waveform developed across resistor 22, being caused only by the constant current which flowed in the emitter 21 during the time transistor 20 was conducting, will be a very sharp negative pulse of width equal to the time interval between the initiating and turn-off triggers. Using transistors with alpha cutoffs of 10 mc., pulses were achieved having rise and fall times of .05 microsecond. By utilizing this circuit, the effects of "hole storage" are completely eliminated from the output pulse since the emitter current is completely cut off when the turn-off trigger is applied.

Although there have been described what are considered to be preferred embodiments of the present invention, various adaptations and modifications thereof may be made without departing from the spirit and scope of the invention as defined in the appended claims.

What is claimed is:

1. A pulse generator comprising a transistor having an emitter electrode, a collector electrode, and a base electrode, an input circuit, an output circuit, one of said electrodes being common to both said input and output circuits biasing means connected to said electrodes such that said transistor is normally nonconducting, a source of triggering voltage connected between a first of said electrodes and said common electrode for selectively placing said transistor in a conducting condition, a delay line connected between a second of said electrodes and said common electrodes, a first impedance element connected in shunt with said delay line said first impedance element being of sufficient value to retain said transistor in a nonconducting condition in the absence of a triggering voltage, and a second impedance element connected in series with said delay line said second impedance element having a value substantially equal to the characteristic impedance of said delay line.

2. A pulse generator comprising a transistor having an emitter electrode, a collector electrode, and a base electrode, an input circuit, an output circuit, one of said electrodes being common to both said input and output circuits biasing means connected to each of said electrodes such that said transistor is normally nonconducting, a delay line connected between said collector electrode and said common electrode for limiting the time during which said transistor conducts current, a first impedance element connected in shunt with said delay line for retaining said transistor in a nonconductive condition in the absence of a triggering voltage, a second impedance element connected in series with said delay line said second impedance element having a value substantially equal to the characteristic impedance of said delay line, and a source of triggering voltage connected between the remaining of said electrodes and said common electrode for selectively placing said transistor in a conducting condition for a length of time determined by said delay line whereby an output pulse of controlled width may be obtained.

3. A pulse generator comprising a first transistor having an emitter electrode, a collector electrode, and a base electrode, said electrodes being biased such that said transistor is normally nonconducting, a source of triggering voltage connected to one of said electrodes of said first transistor for selectively placing said transistor in a conducting condition, a second transistor connected to said first transistor, said second transistor also having an emitter electrode, a collector electrode, and a base electrode, a delay line commonly connected to the collector electrode of each of said transistors, a second source of triggering voltage connected to one of the remaining of said electrodes of said second transistor for placing said second transistor in a conducting condition at a time later than said first transistor conducts whereby an output pulse of controlled width may be obtained.

4. A pulse generator comprising a first transistor having an emitter electrode, a collector electrode, and a base electrode, said transistor being biased such that it is normally nonconducting, a second transistor connected to said first transistor, said second transistor also having an emitter electrode, a collector electrode, and a base electrode, said second transistor also being biased such that it is normally nonconducting, said bias voltage on said emitter of said second transistor having a higher positive value than said bias on said emitter of said second transistor, a source of triggering voltage connected to said first transistor for selectively placing it in a conducting condition, a second source of triggering voltage connected to said second transistor for placing said second transistor in a conducting condition and simultaneously extinguishing conduction in said first transistor whereby an output pulse of controlled width may be obtained.

References Cited in the file of this patent

UNITED STATES PATENTS

| | | |
|---|---|---|
| 2,438,962 | Burlingame et al. | Apr. 6, 1948 |
| 2,467,184 | Blewett | Apr. 12, 1949 |
| 2,496,543 | Kanner | Feb. 7, 1950 |
| 2,652,460 | Wallace | Sept. 15, 1953 |
| 2,666,139 | Endres | Jan. 12, 1954 |